United States Patent
Kim

(10) Patent No.: US 10,734,597 B2
(45) Date of Patent: Aug. 4, 2020

(54) ORGANIC LIGHT-EMITTING DEVICE AND METHOD OF MANUFACTURING THE SAME

(71) Applicant: LG Display Co., Ltd., Seoul (KR)

(72) Inventor: Yong-Il Kim, Danjin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/225,394

(22) Filed: Dec. 19, 2018

(65) Prior Publication Data

US 2019/0123294 A1    Apr. 25, 2019

Related U.S. Application Data

(63) Continuation of application No. 15/608,622, filed on May 30, 2017, now Pat. No. 10,205,115.

(30) Foreign Application Priority Data

May 31, 2016    (KR) .................. 10-2016-0067289

(51) Int. Cl.
*H01L 51/52* (2006.01)
*H01L 27/32* (2006.01)
*H01L 51/56* (2006.01)

(52) U.S. Cl.
CPC ...... *H01L 51/5212* (2013.01); *H01L 27/3246* (2013.01); *H01L 27/3276* (2013.01); *H01L 27/3283* (2013.01); *H01L 27/3288* (2013.01); *H01L 51/5253* (2013.01); *H01L 51/56* (2013.01); *H01L 2251/5392* (2013.01)

(58) Field of Classification Search
CPC ........................................... H01L 51/52
See application file for complete search history.

(56) References Cited

U.S. PATENT DOCUMENTS

| 10,205,115 B2 * | 2/2019 | Kim .................. H01L 27/3246 |
| 2005/0116629 A1 | 6/2005 | Takamura et al. |

FOREIGN PATENT DOCUMENTS

| CN | 1640204 A | 7/2005 |
| CN | 102171851 A | 8/2011 |
| CN | 104798222 A | 7/2015 |
| JP | 2016-35941 A | 3/2016 |
| KR | 10-2014-0042301 A | 4/2014 |
| TW | 200535516 A | 11/2005 |
| TW | 201210102 A | 3/2012 |

* cited by examiner

*Primary Examiner* — Marvin Payen
(74) *Attorney, Agent, or Firm* — Seed IP Law Group LLP

(57) ABSTRACT

Disclosed are an organic light-emitting device and a method of manufacturing the same. In the organic light-emitting device, an auxiliary electrode is formed on anode electrode to come into contact with the anode electrode via the same mask process as the anode electrode, which results in a simplified structure and simplified processing. In addition, a bank is disposed to cover a side surface and an upper surface of the auxiliary electrode and a side surface of the anode electrode, whereby damage to the auxiliary electrode and the anode electrode is prevented.

20 Claims, 7 Drawing Sheets

ORGANIC LIGHT-EMITTING DEVICE AND METHOD OF MANUFACTURING THE SAME

This application is a continuation of U.S. patent application Ser. No. 15/608,622, filed May 30, 2017, which claims the benefit of Korean Patent Application No. 10-2016-0067289, filed on May 31, 2016, which applications are hereby incorporated by reference in their entireties for all purposes as if fully set forth herein.

BACKGROUND

Technical Field

The present disclosure relates to an organic light-emitting device and a method of manufacturing the same, and more particularly, to an organic light-emitting device, which may simplify a structure and a manufacturing process thereof, and a method of manufacturing the same.

Description of the Related Art

An organic light-emitting device is a self-illuminating device using a light-emitting layer between electrodes, and has the advantage of being formed to be very thin. Such an organic light-emitting device has been applied to a display device and a lighting device.

In order to manufacture the organic light-emitting device, a mask process using a photo-mask is performed multiple times. Each mask process involves sub-processes such as, for example, cleaning, exposure, developing, and etching. Thus, whenever a single mask process is added, the manufacturing time and manufacturing costs consumed to manufacture the organic light-emitting device are increased and the incidence of failure is increased, causing deterioration in manufacturing yield. Therefore, there is a demand for solutions for reducing the number of mask processes in order to reduce production costs and to increase production yield and production efficiency.

BRIEF SUMMARY

Accordingly, the present disclosure is directed to organic light-emitting devices and methods of manufacturing the same that substantially obviate one or more problems due to limitations and disadvantages of the related art.

In one or more embodiments, the present disclosure provides an organic light-emitting device, which may simplify a structure and a manufacturing process thereof, and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in an organic light-emitting device according to the present disclosure, an auxiliary electrode is formed via the same mask process as an anode electrode to be disposed on and come into contact with the anode electrode, which may simplify a structure and a manufacturing process of the organic light-emitting device, and a bank is disposed to cover a side surface and an upper surface of the auxiliary electrode and a side surface of the anode electrode, which may prevent damage to the auxiliary electrode and the anode electrode.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, embodiments of the present disclosure will be described in detail with reference to the accompanying drawings.

Figure 1:
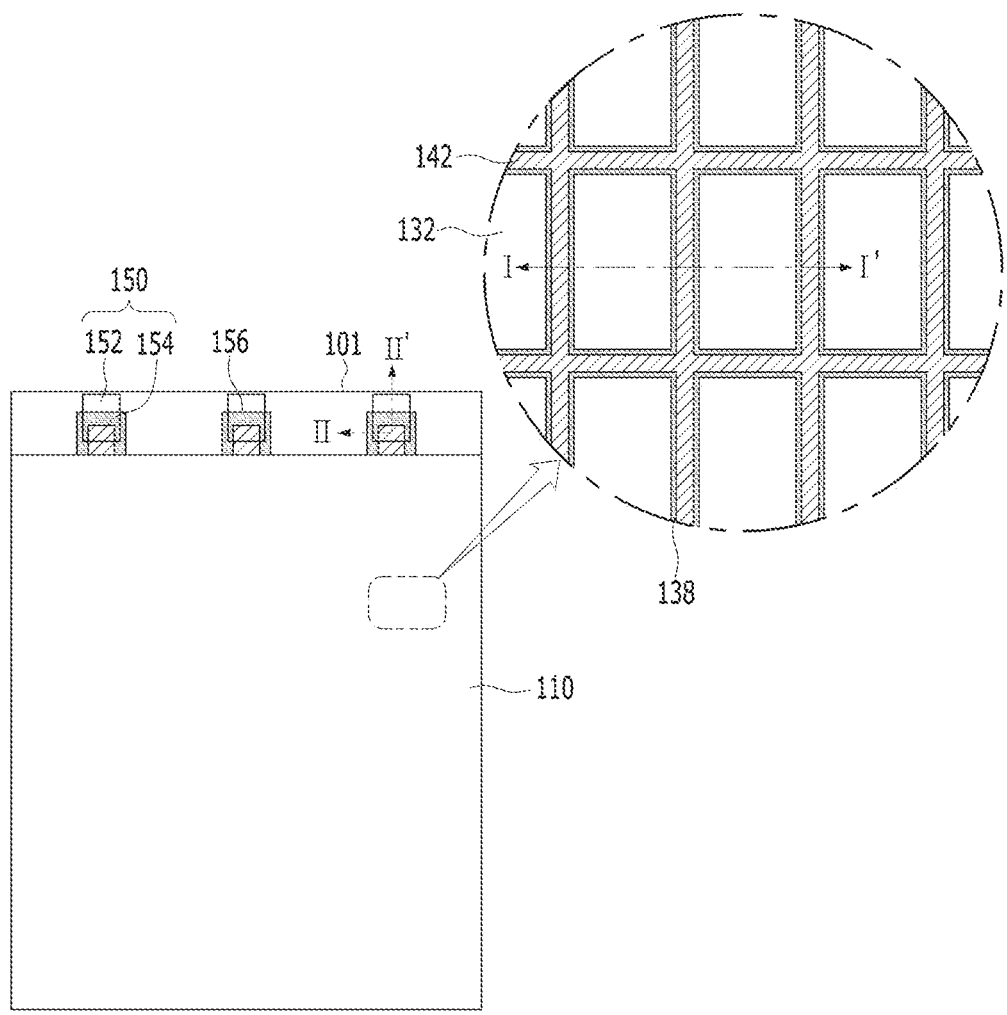
FIG. 1 is a plan view illustrating an organic light-emitting device according to a first embodiment of the present disclosure.
Figure 2:
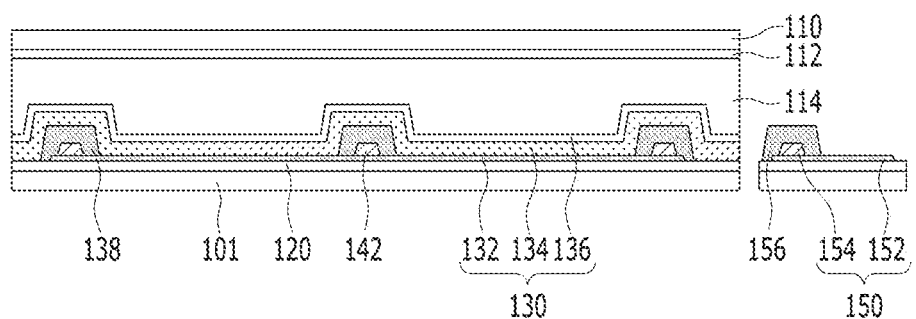
FIG. 2 is a cross-sectional view illustrating the organic light-emitting device taken along line "I-I" and line "II-II" in FIG. 1.

FIG. 1 is a plan view illustrating an organic light-emitting device having a light-emitting layer according to the present disclosure, and FIG. 2 is a cross-sectional view illustrating the organic light-emitting device illustrated in FIG. 1.

The organic light-emitting device illustrated in FIGS. 1 and 2 includes a light extraction layer 120 formed on a substrate 101, a bank 138, a light-emitting element 130, a pad 150, and an encapsulation layer 110.

The light extraction layer 120 is formed between an anode electrode 132, which is located underneath a light-emitting layer 134, and the substrate 101, and serves to increase light extraction efficiency by inducing the scattering of light generated in the light-emitting layer 134. The light extraction layer 120 may also be formed on the back surface of the substrate 101. The light extraction layer 120 is formed by dispersing scattered particles such as beads in a binder.

The light-emitting element 130 includes the anode electrode 132, the light-emitting layer 134 formed on the anode electrode 132, and a cathode electrode 136 formed on the light-emitting layer 134.

The anode electrode 132 is formed on the light extraction layer 120. The anode electrode 132 is formed of a transparent conductive layer such as indium tin oxide (ITO) or indium zinc oxide (IZO). In order to reduce the resistance of the anode electrode 132, an auxiliary electrode 142 is formed on the anode electrode 132 to come into contact with the anode electrode 132. For example, the auxiliary electrode 142 is formed in a single layer or in multiple layers using any one of molybdenum (Mo), aluminum (Al), chrome (Cr), gold (Au), titanium (Ti), nickel (Ni), neodymium (Nd), and copper (Cu) or an alloy thereof, which has higher conductivity than the anode electrode 132. The auxiliary electrode 142 may be formed in a lattice form (e.g., with criss-crossing strips of the auxiliary electrode 142, as shown), and the bank 138 may be formed to overlap the auxiliary electrode 142. In addition, since the auxiliary electrode 142 is formed via the same mask process as the anode electrode 132, the side surface of the auxiliary electrode 142 located on the anode electrode 132 is stepped with respect to, or forms a straight line with respect to, the side surface of the anode electrode 132.

The organic light-emitting layer 134 is formed on the anode electrode 132 in an emission area defined by the bank 138. The organic light-emitting layer 134 may be formed on the anode electrode 132 by stacking a hole layer, an emission layer, and an electron layer one above another in this order or in the reverse order.

The cathode electrode 136 is formed on the organic light-emitting layer 134 to be opposite the anode electrode 132 with the organic light-emitting layer 134 interposed therebetween. The cathode electrode 136 is formed using a metal material having a high reflection efficiency. For example, the cathode electrode 136 may take the form of a stack including a transparent conductive layer formed of indium tin oxide (ITO) or indium zinc oxide (IZO) and a metal layer formed of, for example, aluminum (Al), silver (Ag), or APC (Ag;Pb;Cu).

The bank 138 is formed along the auxiliary electrode 142 to overlap the auxiliary electrode 142, thus taking the form of an island that opens the emission area (i.e., the emission area is formed between respective portions of the bank 138). The bank 138 is formed to cover the side surface and the upper surface of the auxiliary electrode 142 and the side surface of the anode electrode 132. In this case, since the distance between the cathode electrode 136 and each of the anode electrode 132 and the auxiliary electrode 142 is increased by the thickness of the bank 138 compared to the related art, the occurrence of short-circuit failures between the cathode electrode 136 and each of the anode electrode 132 and the auxiliary electrode 142 may be reduced. In addition, since the bank 138 is formed to cover the side surface of the anode electrode 132, for example, corrosion of the anode electrode 132 may be prevented. The bank 138 is formed of an organic insulating material having a photoinitiator, for example, photo acryl. The bank 138 formed of an organic insulating material may be formed via a photolithography process alone, without an etching process, which may simplify processing.

The encapsulation layer 110 is bonded to the substrate 101, on which the light-emitting element 130 has been formed, via an adhesive film 112, which is formed on the entire surface of the encapsulation layer 110, to seal the light-emitting element 130. Thereby, the encapsulation layer 110 prevents the introduction of external moisture or oxygen from the upper side thereof. Meanwhile, a protective insulation layer 114 is formed between the adhesive film 112 and the cathode electrode 136. The protective insulation layer 114 is formed to cover the side surface and the upper surface of the organic light-emitting device, and therefore prevents the entry of, for example, external moisture, hydrogen and oxygen from the side surface and the upper surface of the organic light-emitting device. The protective insulation layer 114 is formed of an inorganic insulation layer such as, for example, SiNx or SiOx.

Meanwhile, one or more pads 150 are formed on the substrate 101 exposed by the encapsulation layer 110. Each of the pads 150 supplies a drive signal from an integrated drive circuit to the anode electrode 132 or the cathode electrode 136. To this end, each of the pads 150 includes a pad lower electrode 152 and a pad upper electrode 154.

The pad lower electrode 152 is formed on the light extraction layer 120 to be exposed outwardly, thereby being electrically connectable to a circuit film on which the integrated drive circuit is mounted. The pad lower electrode 152 is formed of the same material as the anode electrode 132. For example, the pad lower electrode 152 may be formed of a transparent conductive layer having strong corrosion resistance and acid resistance such as gallium and aluminum doped zinc oxide (GAZO), indium tin oxide (ITO), indium zinc oxide (IZO), or indium tin zinc oxide (ITZO).

The pad upper electrode 154 is disposed on the pad lower electrode 152 and has a smaller line width as the pad lower electrode 152. The pad upper electrode 154 is formed on the pad lower electrode 152 using the same material as the auxiliary electrode 142, thereby serving to reduce the resistance of the pad lower electrode 152. To this end, the pad upper electrode 154 may be formed in a single layer or in multiple layers using any one of molybdenum (Mo), aluminum (Al), chrome (Cr), gold (Au), titanium (Ti), nickel (Ni), neodymium (Nd), and copper (Cu) or an alloy thereof, which has higher conductivity than the pad lower electrode 152.

A pad protective layer 156 is formed using the same material as the bank 138 to cover the side surface and the upper surface of the pad upper electrode 154. Thereby, the pad protective layer 156 may prevent the pad upper electrode 154 from being corroded by, for example, external moisture.

FIGS. 3A to 3F are cross-sectional views for explaining a method of manufacturing the organic light-emitting device illustrated in FIG. 2.

Figure 3A:
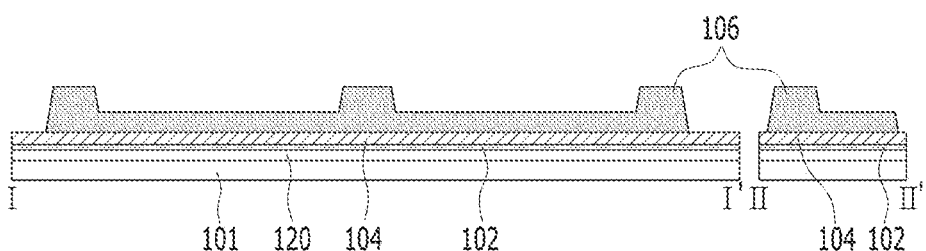
FIGS. 3A to 3F are cross-sectional views illustrating a method of manufacturing the organic light-emitting device illustrated in FIG. 2.
Figure 3B:
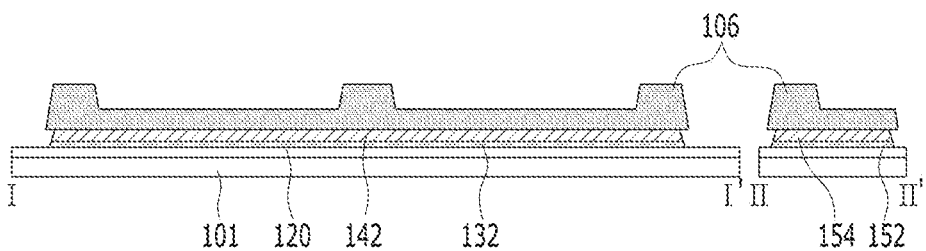
Figure 3C:
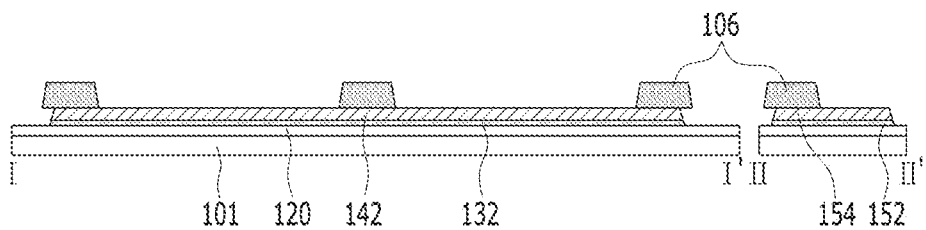
Figure 3D:
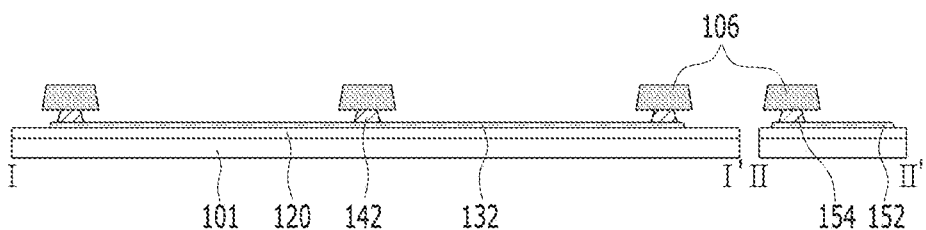
Figure 3E:
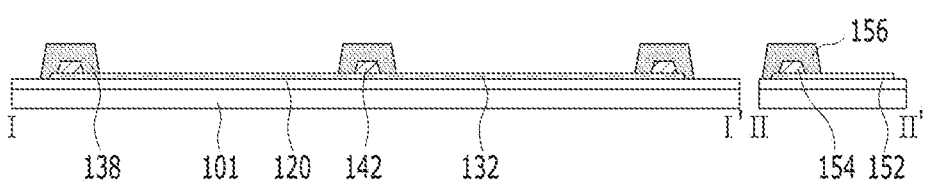
Figure 3F:
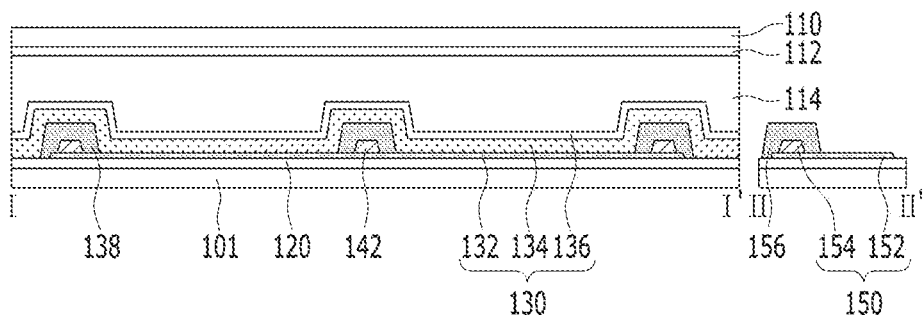

As illustrated in FIG. 3A, the light extraction layer 120 is formed on the entire surface of the substrate 101. Next, a transparent conductive layer 102 and an opaque conductive layer 104 are sequentially stacked one above another on the entire surface of the light extraction layer 120. Next, a photosensitive layer is applied to the entire surface of the opaque conductive layer 104, and is then patterned via exposure and developing processes using a first mask, which is a halftone mask or a slit mask, whereby a bank photosensitive pattern 106 having a multistep structure is formed. The bank photosensitive pattern 106 is formed in a first thickness on the area in which an anode electrode and a pad lower electrode will be formed and is also formed in a second thickness, which is greater than the first thickness, on the area in which an auxiliary electrode and a pad upper electrode will be formed. When the transparent conductive layer 102 and the opaque conductive layer 104 are subjected to wet etching using the bank photosensitive pattern 106 as a mask, as illustrated in FIG. 3B, the anode electrode 132 and the auxiliary electrode 142 having the same pattern are formed and the pad lower electrode 152 and the pad upper electrode 154 having the same pattern are formed. Next, through the ashing of the bank photosensitive pattern 106, as illustrated in FIG. 3C, the bank photosensitive pattern 106 having the first thickness is removed, and the bank photosensitive pattern 106 having the second thickness is reduced in thickness. When the opaque conductive layer 104 is subjected to wet etching using the bank photosensitive pattern 106 having the reduced thickness, as illustrated in FIG. 3D, the opaque conductive layer 104 remaining on the anode electrode 132 and the pad lower electrode 152 is removed, except for those portions of the opaque conductive layer 104 underlying the bank photosensitive pattern 106. Next, as illustrated in FIG. 3E, through the reflow of the bank photosensitive pattern 106 using a curing process, the bank 138 and the pad protective layer 156 are formed. The bank 138 is formed to cover the side surface of the anode electrode 132 and the side surface and the upper surface of the auxiliary electrode 142, and therefore, may prevent, for example, corrosion of the anode electrode 132 and the auxiliary electrode 142. The pad protective layer 156 is formed to cover the upper surface and the side surface of the pad upper electrode 154, and therefore may prevent, for example, corrosion of the pad upper electrode 154. Next, as illustrated in FIG. 3F, the organic light-emitting layer 134, the cathode electrode 136, and the protective insulation layer 114 are sequentially formed on the entire surface of the substrate 101 on which the bank 138 and the pad protective layer 156 have been formed. Next, the encapsulation layer 110 is attached to the protective insulation layer 114 via the adhesive film 112.

As described above, in the organic light-emitting device according to the first embodiment of the present disclosure, the anode electrode 132, the auxiliary electrode 142, and the bank 138 are formed via the same single mask process. Thereby, the present disclosure may reduce the number of mask processes by at least twice compared to the related art, which may increase productivity and reduce costs.

Figure 4:
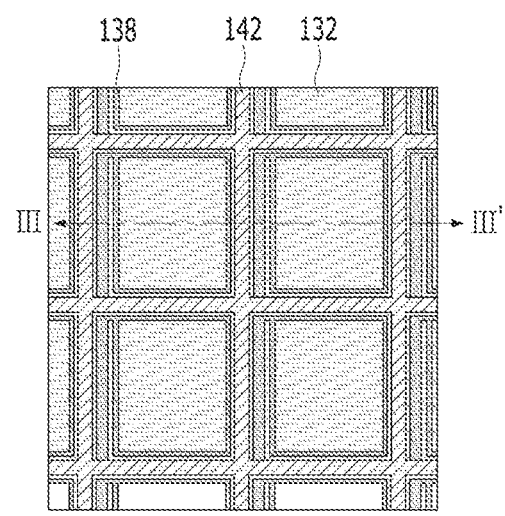
FIG. 4 is a plan view illustrating an organic light-emitting device according to a second embodiment of the present disclosure.
Figure 5:
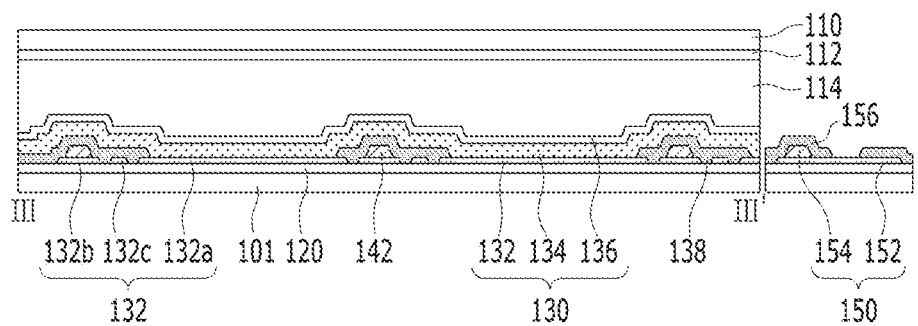
FIG. 5 is a cross-sectional view illustrating the organic light-emitting device illustrated in FIG. 4.

FIGS. 4 and 5 are a plan view and a cross-sectional view illustrating an organic light-emitting device according to a second embodiment of the present disclosure. FIG. 4 illustrates only a portion of the organic light-emitting device (e.g., an enlarged region which generally corresponds to the enlarged region shown in FIG. 1). While not shown in FIG. 4, the organic light-emitting device according to the second embodiment further includes pads 150 (shown in the cross-sectional view of FIG. 5) which may be disposed in a similar region as in the organic light-emitting device according to the first embodiment shown in FIG. 1.

Compared to the organic light-emitting device illustrated in FIGS. 1 and 2, the organic light-emitting device illustrated in FIGS. 4 and 5 includes the same constituent elements except that the bank 138 is formed of an inorganic insulation material and the anode electrode 132 includes a short-circuit-preventing portion 132c. Thus, a detailed description related to the same constituent elements will be omitted.

Figure 6:
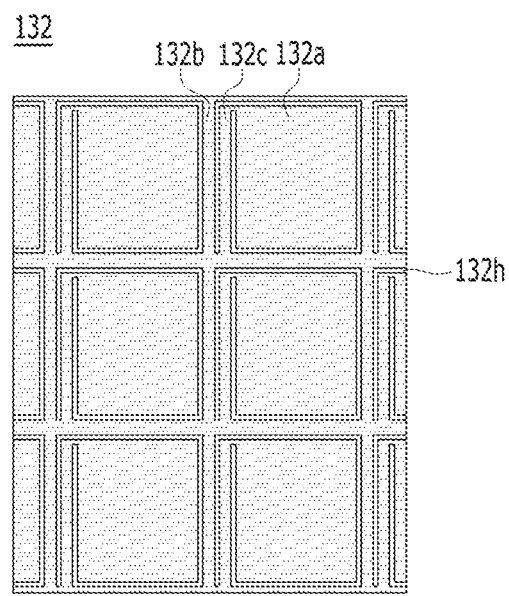
FIG. 6 is a plan view illustrating in detail an anode electrode of the organic light-emitting device illustrated in FIG. 4.

The anode electrode 132 is formed on the light extraction layer 120. The anode electrode 132 is formed of a transparent conductive layer such as indium tin oxide (ITO) or indium zinc oxide (IZO). As illustrated in FIGS. 5 and 6, the anode electrode 132 includes an anode portion 132a, a contact portion 132b, and a short-circuit-preventing portion 132c.

The anode portion 132a is the region that overlaps the emission area defined by the bank 138, and overlaps the cathode electrode 136 with the light-emitting layer 134 interposed therebetween.

The contact portion 132b is disposed underneath the auxiliary electrode 142 to come into contact with the auxiliary electrode 142, and is formed in a lattice form.

The short-circuit-preventing portion 132c is located between the contact portion 132b of the anode electrode and the anode portion 132a of the anode electrode. The short-circuit-preventing portion 132c is spaced apart from each of the contact portion 132b and the anode portion 132a by a predetermined distance, with an anode hole 132h interposed therebetween (FIG. 6). As shown in FIG. 5, the short-circuit-preventing portion 132c may have a smaller line width than the contact portion 132b and the anode portion 132a, to have a higher resistance value than the contact portion 132b and the anode portion 132a. Thereby, when a short-circuit defect is generated by, for example, foreign substances between the cathode electrode 136 and the anode electrode 132 in a predetermined emission area, the short-circuit-preventing portion 132c prevents the leakage of current from the light-emitting element 130 in another emission area through the short-circuit defect.

Since the bank 138 formed of an inorganic insulation material has a smaller height than the bank formed of an organic insulation material (e.g., as in the first embodiment, shown in FIGS. 1 and 2), the height difference between the bank 138 and the first electrode 132 may be reduced in the organic light-emitting device according to the second embodiment. Thereby, the upper layer (e.g., the light-emitting layer 134 and the cathode electrode 136), which is disposed on the bank 138 to cover the bank 138, may improve step coverage. Through the improved step coverage of the upper layer disposed on the bank 138, when the encapsulation layer 110 is formed via a roll-printing process, the step coverage of the encapsulation layer 110 may also be improved, which ensures an easy encapsulation process. In addition, the bank 138 is disposed to cover the upper surface and the side surface of each of the contact portion 132b and the short-circuit-preventing portion 132c of the anode electrode and the side surface of the anode portion 132a. In this case, since the distance between the cathode electrode 136 and each of the anode electrode 132 and the auxiliary electrode 142 is increased by the thickness of the bank 138 compared to the related art, the occurrence of short-circuit failure between the cathode electrode 136 and each of the anode electrode 132 and the auxiliary electrode 142 may be reduced.

FIGS. 7A to 7F are cross-sectional views for explaining a method of manufacturing the organic light-emitting device illustrated in FIG. 5.

Figure 7A:
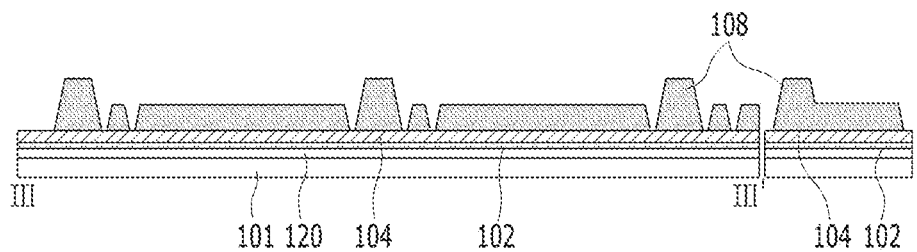
FIGS. 7A to 7F are cross-sectional views illustrating a method of manufacturing the organic light-emitting device illustrated in FIG. 5.
Figure 7B:
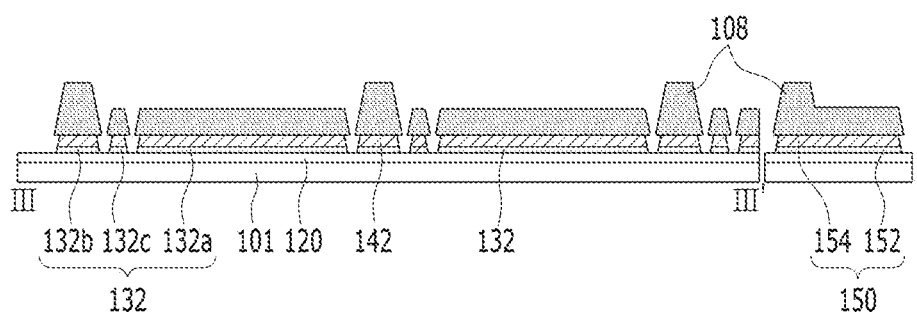
Figure 7C:
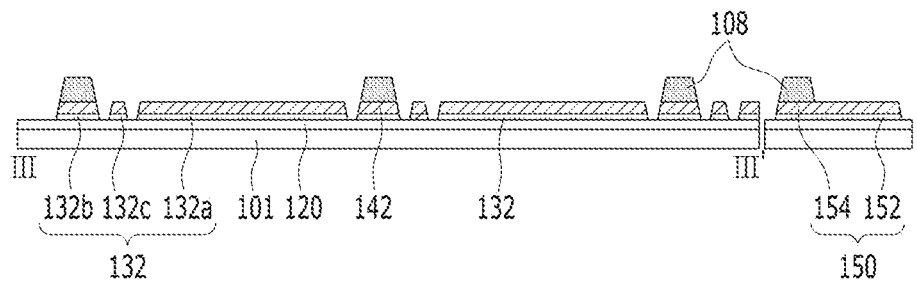
Figure 7D:
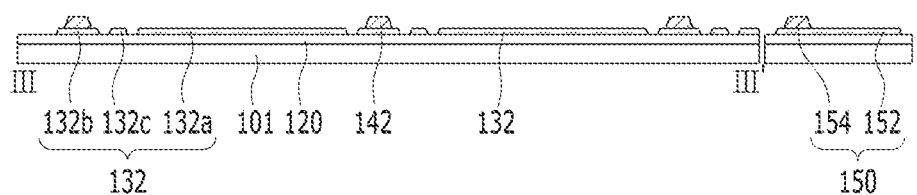
Figure 7E:
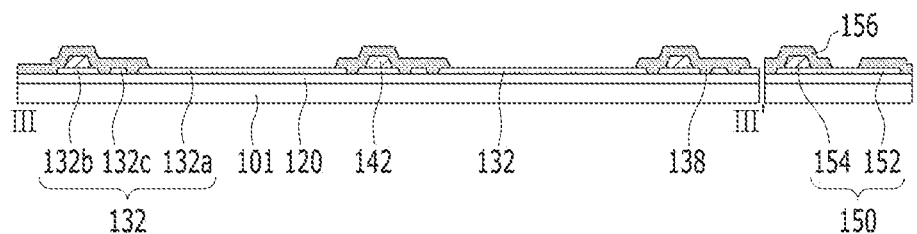
Figure 7F:
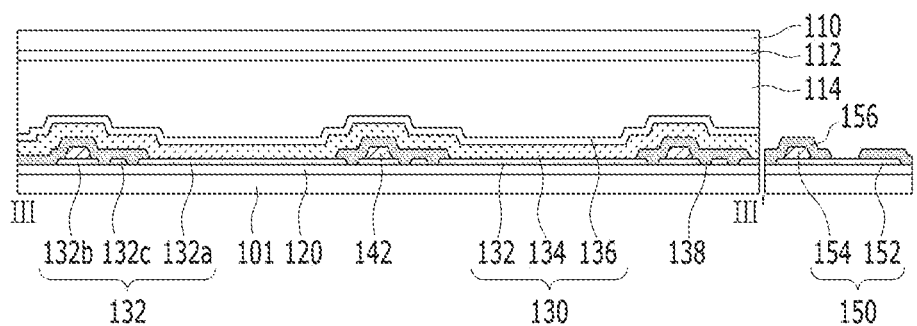

As illustrated in FIG. 7A, the light extraction layer 120 is formed on the entire surface of the substrate 101. Next, the transparent conductive layer 102 and the opaque conductive layer 104 are sequentially stacked one above another on the entire surface of the light extraction layer 120. Next, a photosensitive layer is applied to the entire surface of the opaque conductive layer 104, and is then patterned via exposure and developing processes using a first mask, which is a halftone mask or a slit mask, whereby an anode photosensitive pattern 108 having a multistep structure is formed. The anode photosensitive pattern 108 is formed in a first thickness on the area in which an anode portion and a short-circuit-preventing portion of an anode electrode and a pad lower electrode will be formed, and is formed in a second thickness, which is greater than the first thickness, on the area in which a contact portion of the anode electrode and a pad upper electrode will be formed. When the transparent conductive layer 102 and the opaque conductive layer 104 are subjected to wet etching using the anode photosensitive pattern 108 as a mask, as illustrated in FIG. 7B, the anode electrode 132, the auxiliary electrode 142, the pad lower electrode 152 and the pad upper electrode 154 are formed. Next, through the ashing of the anode photosensitive pattern 108, as illustrated in FIG. 7C, the anode photosensitive pattern 108 having the first thickness is removed, and the anode photosensitive pattern 108 having the second thickness is reduced in thickness. When the opaque conductive layer 104 is subjected to wet etching using the anode photosensitive pattern 108 having the reduced thickness, as illustrated in FIG. 7D, the opaque conductive layer 104 remaining on the anode portion 132a, the short-circuit-preventing portion 132c, and the pad lower electrode 152 is removed. Next, as illustrated in FIG. 7E, an inorganic insulation material such as SiNx or SiOx is deposited on the entire surface of the substrate on which the anode electrode 132, the auxiliary electrode 142, the pad lower electrode 152 and the pad upper electrode 154 have been formed, and is then patterned via a photolithography process and an etching process using a second mask, whereby the bank 138 and the pad protective layer 156 are formed. Next, as illustrated in FIG. 7F, the organic light-emitting layer 134, the cathode electrode 136, and the protective insulation layer 114 are sequentially formed on the entire surface of the substrate 101 on which the bank 138 and the pad protective layer 156 have been formed. Next, the encapsulation layer 110 is attached to the protective insulation layer 114 via the adhesive film 112.

As described above, in the organic light-emitting device according to the second embodiment of the present disclosure, the anode electrode 132 and the auxiliary electrode 142 are formed via the same single mask process. Thereby, the present disclosure may reduce the number of mask processes by at least one compared to the related art, which may increase productivity and reduce costs.

Meanwhile, the organic light-emitting device according to the embodiments provided by the present disclosure may be applied to a display device and a lighting apparatus.

According to embodiments of the present disclosure, in an organic light-emitting device according to the present disclosure, since an auxiliary electrode is formed via the same mask process as an anode electrode, the number of mask processes may be reduced by at least one compared to the related art, which may simplify a structure and processing. In addition, according to the present disclosure, since a bank is disposed to cover a side surface and an upper surface of the auxiliary electrode and a side surface of the anode electrode, the occurrence of short-circuit failure between the auxiliary electrode, the anode electrode, and a cathode electrode may be reduced, and corrosion of the anode electrode may be prevented.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Accordingly, various embodiments disclosed in the present disclosure are not intended to limit the technical sprit of the present disclosure, and the scope of the technical sprit of the present disclosure should be interpreted based on the following claims, and all technical ideas that fall within the range equivalent to the claims should be understood as belonging to the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting device comprising:
   a substrate;
   a first electrode on the substrate, the first electrode having a first portion and a second portion different from the first portion, the first portion of the first electrode extending in a first direction of the substrate and extending in a second direction transverse to the first direction to form a lattice shape;
   a light-emitting layer on the first electrode;
   a second electrode on the light-emitting layer;
   an auxiliary electrode connected to and on the first portion of the first electrode; and
   a bank overlapping the auxiliary electrode and forming an emission area on the substrate.

2. The device according to claim 1, wherein the second portion of the first electrode includes:
   an emitting portion in the emission area of the light-emitting layer; and
   an auxiliary portion between the first, portion and the emitting portion.

3. The device according to claim 2, wherein the bank is further disposed on the auxiliary portion of the first electrode.

4. The device according to claim 3, wherein the bank covers a side surface and an upper surface of the auxiliary portion of the first electrode, and the bank covers a side surface of the emitting portion the first electrode.

5. The device according to claim 4, further comprising:
   a light extraction layer between the bank and the substrate or on a back surface of the substrate.

6. The device according to claim 5, wherein the light extraction layer serves to increase light extraction efficiency.

7. The device according to claim 6, wherein the light extraction layer includes a plurality of scattered particles in a binder.

8. The device according to claim 2, wherein the auxiliary portion of the first electrode has a smaller line width than at least one of the first portion and the emitting portion.

9. The device according to claim 8, wherein the auxiliary portion of the first electrode surrounds at least one of the first portion and the emitting portion.

10. The device according to claim 2, wherein the bank overlaps an upper surface and a side surface of each of the first portion and the auxiliary portion, and the bank covers a side surface of the emitting portion.

11. The device according to claim 1, wherein the bank has a lattice form corresponding to the first portion of the auxiliary electrode.

12. The device according to claim 1, wherein the light-emitting layer is disposed on a part of the bank on the first electrode.

13. The device according to claim 1, further comprising:
   an encapsulation layer on the bank.

14. The device according to claim 1, wherein the auxiliary electrode connected to the first electrode has a side surface that is aligned with a side surface of the first electrode.

15. The device according to claim 1, further comprising:
   one or more pads configured to supply a drive signal from an integrated drive circuit to the first electrode or the second electrode on the substrate.

16. The device according to claim 15, wherein the one or more pads includes:
a first pad electrode on the substrate;
a second pad electrode on the first pad electrode; and
a pad protective layer on the second pad electrode.

17. The device according to claim 16, wherein one of the first pad electrode or the second pad electrode is formed in a single layer or in multiple layers.

18. The device according to claim 17, wherein the pad protective layer is formed of a same material as the bank selected from one of an organic insulation material and inorganic insulation material.

19. The device according to claim 16, wherein the pad protective layer partially overlaps with the first pad electrode and the second pad electrode.

20. The device according to claim 1, wherein the first electrode is formed of a transparent conductive material and the auxiliary electrode is formed of a metal material having a higher conductivity than the first electrode.

* * * * *